US012562547B2

(12) United States Patent
Shen et al.

(10) Patent No.: US 12,562,547 B2
(45) Date of Patent: Feb. 24, 2026

(54) INTEGRATION METHOD FOR MODULARIZED SILICON-BASED HETEROGENEOUS PHOTOELECTRIC INTEGRATED ARCHITECTURE

(71) Applicant: HUBEI JIUFENGSHAN LABORATORY, Wuhan (CN)

(72) Inventors: XiaoAndy Shen, Wuhan (CN); Siyang Liu, Wuhan (CN); Changyu Hu, Wuhan (CN); Beibei Wu, Wuhan (CN)

(73) Assignee: HUBEI JIUFENGSHAN LABORATORY, Wuhan (CN)

( * ) Notice: Subject to any disclaimer, the term of this patent is extended or adjusted under 35 U.S.C. 154(b) by 0 days.

(21) Appl. No.: 19/237,474

(22) Filed: Jun. 13, 2025

(65) Prior Publication Data

US 2025/0309610 A1     Oct. 2, 2025

Related U.S. Application Data

(63) Continuation of application No. PCT/CN2024/125854, filed on Oct. 18, 2024.

(30) Foreign Application Priority Data

Nov. 16, 2023     (CN) .......................... 202311528145.4

(51) Int. Cl.
*H01S 5/02355*     (2021.01)
*H10F 55/00*     (2025.01)

(52) U.S. Cl.
CPC ......... *H01S 5/02355* (2021.01); *H10F 55/00* (2025.01)

(58) Field of Classification Search
CPC ................... H01S 5/021; H01S 5/0218; H01S 5/0262–0264; H01S 5/0261; H01S 5/026; H01S 5/0265; H01S 5/0267; G02B 6/12002; G02B 6/12004; G02B 2006/12038; G02B 2006/12078; G02B 2006/1204
See application file for complete search history.

(56) References Cited

U.S. PATENT DOCUMENTS 9,372,307 B1     6/2016 Budd et al.
9,933,566 B2 *     4/2018 Patel ...................... G02B 6/125
(Continued)

FOREIGN PATENT DOCUMENTS

CN     115542458 B  *  2/2023   ......... G02B 6/12007
CN     117055151 A   11/2023
(Continued)

*Primary Examiner* — Joshua King
(74) *Attorney, Agent, or Firm* — Nitin Kaushik

(57)     ABSTRACT

The present invention relates to an integration method for a modularized silicon-based heterogeneous photoelectric integrated architecture. According to the integration method, a modularized form is adopted, different functional units are used as individual unit modules, and then different types of integrated architectures are formed through customized increase and decrease in different usage scenarios. Among them, customized combinations of one unit module, two unit modules up to five unit modules can be adopted to construct up to 22 types of module-combined integrated architectures. By adopting a modularized solution, various functional materials can be easily selected and combined, thus improving a degree of freedom of integration and reducing costs.

5 Claims, 21 Drawing Sheets

(56)          References Cited

U.S. PATENT DOCUMENTS

| | | | | |
|---|---|---|---|---|
| 10,481,326 B2 * | 11/2019 | Patel | .................... | G02B 6/4274 |
| 10,788,689 B1 * | 9/2020 | Lentine | ................. | G02F 1/0356 |
| 11,675,126 B1 * | 6/2023 | Kodigala | ................ | H01S 5/209 |
| | | | | 385/14 |
| 2015/0010266 A1 * | 1/2015 | Webster | .................... | G02B 6/14 |
| | | | | 438/31 |
| 2017/0139142 A1 * | 5/2017 | Patel | .................. | G02B 6/12004 |
| 2018/0314004 A1 * | 11/2018 | Fathpour | ............. | G02B 6/1228 |
| 2021/0116637 A1 * | 4/2021 | Li | ...................... | G02B 6/12004 |
| 2022/0317483 A1 * | 10/2022 | Chakravarty | ........... | G02F 1/035 |
| 2022/0365294 A1 * | 11/2022 | Chen | .................... | G02B 6/4201 |
| 2023/0107643 A1 * | 4/2023 | Paolella | ................... | G02B 6/13 |
| | | | | 385/14 |
| 2024/0085621 A1 * | 3/2024 | Hsia | ................... | G02B 6/12004 |
| 2024/0103218 A1 * | 3/2024 | Hsia | ....................... | G02B 6/122 |
| 2024/0103236 A1 * | 3/2024 | Tseng | .................. | G02B 6/4214 |
| 2024/0142809 A1 * | 5/2024 | Preisler | ................. | G02B 6/136 |
| 2024/0337870 A1 * | 10/2024 | Patel | ....................... | G02F 1/035 |

FOREIGN PATENT DOCUMENTS

| | | | | | |
|---|---|---|---|---|---|
| CN | 117059631 A | | 11/2023 | | |
| CN | 117254345 A | | 12/2023 | | |
| CN | 117316940 A | * | 12/2023 | ............. | H10F 77/50 |
| WO | WO-2022067268 A2 | * | 3/2022 | ......... | H10F 77/1437 |

* cited by examiner

SiN 31
32
33

INTEGRATION METHOD FOR MODULARIZED SILICON-BASED HETEROGENEOUS PHOTOELECTRIC INTEGRATED ARCHITECTURE

CROSS-REFERENCE TO RELATED APPLICATIONS

The present application claims priority to Chinese patent application No. 202311528145.4, filed with the China National Intellectual Property Administration on 16 Nov. 2023, entitled "Modularized Silicon-based Heterogeneous Photoelectric Integrated Architecture and Method", the entire contents of which are incorporated herein by reference.

TECHNICAL FIELD

The present invention relates to the technical field of silicon-based optoelectronic heterogeneous integration, and in particular, to an integration method for a modularized silicon-based heterogeneous photoelectric integrated architecture.

BACKGROUND

With the increasing demand for data transmission bandwidth, copper interconnects have gradually approached their physical limits. In contrast, optical interconnects can provide higher bandwidth and lower transmission loss, making the trend of "optical access for replacing copper access" gradually become a consensus. Silicon serves as a mainstream material in manufacturing of integrated circuits and also possesses excellent photoelectric properties. Therefore, the realization of photoelectric integration using silicon as a carrier has given rise to the derivation of silicon-based optoelectronics (silicon photonics) technology.

In recent years, silicon photonics technology has rapidly developed due to its advantages of low cost, stable performance, and mature processes, and has gradually begun to replace conventional III-V group compound semiconductors in the optical communication market. The silicon photonics process developed based on an SOI platform inherently possesses a relatively complete system of optical components, including various types of passive devices, electro-optic modulators, photoelectric detectors, and wavelength division multiplexers. However, limited by the low luminescence efficiency and weak photoelectric effects of silicon-based materials, the performance of active devices such as lasers and modulators has been difficult to improve. Therefore, researchers have begun to explore how to heterogeneously integrate superior photoelectric materials with a silicon photonic platform. This not only integrates the advantages of the silicon photonic platform such as low cost, low loss, and high integration level, but also utilizes the excellent photoelectric properties of heterogeneous materials. For example, indium phosphide (InP) and other III-V group compounds, serving as conventional photoelectric application materials, have the advantages of high electron mobility, good radiation resistance, and large width of forbidden bands, making them conventional manufacturing materials for laser sources in communication bands. Lithium niobate thin films exhibit excellent electro-optic, non-linear optical, and thermoelectric properties, along with high melting points, transmittance ranging from visible light to mid-infrared light, as well as good mechanical properties and chemical stability. Compared to silicon-based modulators, lithium niobate thin film modulators can achieve ultra-high-speed modulation with low power consumption and low loss.

The U.S. Pat. No. 11,675,126B1: Heterogenous integration of an electro-optical platform, disclosed in 2023, provides a hybrid photonic integrated circuit and a manufacturing method thereof, where after a silicon photonic functional device is fabricated on an SOI wafer, thin film lithium niobate is bonded to a silicon photonic wafer, a substrate of the silicon photonic wafer is then removed, and at least one III-V die is bonded thereto. This technology mentions the integration of CMOS electronic chips, but does not provide a reasonable solution for silicon-based photoelectric integration, nor does it mention the integration of photoelectric chips.

The U.S. Pat. No. 9,507,089B2: Method of manufacturing a photonic integrated circuit optically coupled to a laser of III-V material, disclosed in 2016, describes a method for manufacturing an integrated circuit, where the integrated circuit structurally includes an SOI silicon photonic component and a III-V laser; and after a wafer substrate including a silicon photonic device is removed, the silicon photonic component and the III-V laser are bonded and integrated, and then the III-V laser is manufactured. However, this patent only provides the heterogeneous integration of the SOI silicon photonic component and the III-V laser, without involving a specific integration method.

In summary, the integration sequence of various functional materials in the prior art is highly dependent, making it difficult to easily achieve customized selection of increasing or decreasing the functional materials. Furthermore, a reasonable integration method has not yet emerged.

SUMMARY

Based on the above description, the present invention provides an integration method for a modularized silicon-based heterogeneous photoelectric integrated architecture, in order to solve a technical problem that an integration sequence of various functional materials in the prior art is highly dependent, making it difficult to easily achieve customized selection of increasing or decreasing the functional materials.

To solve the above technical problem, the present invention adopts the following technical solution:

An integration method for a modularized silicon-based heterogeneous photoelectric integrated architecture, where the integration method is used for integrating a modularized silicon-based heterogeneous photoelectric integrated architecture and includes the following steps:

S1, integrating an ultra-low-loss material module, a high-frequency material module, and an integrated circuit module on a first silicon wafer;

S2, preparing a laser material module on a second silicon wafer, and performing wafer-level bonding on the first silicon wafer and the second silicon wafer;

S3, thinning a substrate on the first silicon wafer;

S4, extracting a redistribution layer electrode at a bonding interface of a third silicon wafer containing the integrated circuit module and the first silicon wafer to form a first silicon via;

S5, forming a second through silicon via which is electrically connected to the metal electrode of a III-V laser device;

S6, preparing micro-bumps on the first silicon via and the second silicon via for packaging with a printed circuit board, where the step S1 includes:

S11, selecting the first silicon wafer, and fabricating a passive optical device and a germanium device on top silicon of the first silicon wafer to obtain a silicon photonic module;

S12, providing the ultra-low-loss material module on the silicon photonic module, where the ultra-low-loss material module includes a SiN device formed on the first silicon wafer by etching after SiN deposition;

S13, heterogeneously bonding a thin film lithium niobate on the first silicon wafer, and etching the thin film lithium niobate to form a thin film lithium niobate device;

S14, providing a plurality of layers of metal and vias on the germanium device and the thin film lithium niobate device to form a metal electrode; and S15, performing wafer-level hybrid bonding on a third silicon wafer containing the integrated circuit module and the first silicon wafer, and removing a substrate of the first silicon wafer;

the step S2 includes:

S21, fabricating a passive photonic device on the second silicon wafer;

S22, providing a III-V group semiconductor epitaxial material on the second silicon wafer;

S23, performing etching on the III-V group semiconductor epitaxial material to form a III-V laser device; and S24, fabricating a plurality of layers of metal and vias on the III-V laser device to form a metal electrode, where the step S22 includes: heterogeneously bonding the III-V group semiconductor epitaxial material to the second silicon wafer by a wafer-to-wafer method or a chip-to-wafer method, where the III-V group semiconductor epitaxial material includes an upper cladding layer, an active layer, and a lower cladding layer.

Compared to the prior art, the technical solution of the present application has the following beneficial technical effects:

According to a silicon-based heterogeneous photoelectric integrated architecture provided by the present application, a modularized form is adopted, different functional units are used as individual unit modules, and then different types of integrated architectures are formed through customized increase and decrease in different usage scenarios. Among them, customized combinations of one unit module, two unit modules up to five unit modules can be adopted to construct up to 22 types of module-combined integrated architectures. By adopting a modularized solution, various functional materials can be easily selected and combined, thus improving a degree of freedom of integration and reducing costs.

On the basis of the above technical solution, the present invention can also be improved as follows.

Further, the high-frequency material module includes thin film lithium niobate capable of being heterogeneously bonded to a wafer of the silicon photonic module.

Further, the ultra-low-loss material module includes a SiN device formed by etching after SiN deposition via PECVD or LPCVD.

Further, the wafer of the integrated circuit module is connected to the wafer of the silicon photonic module by bonding in a form of chip-to-wafer or wafer-to-wafer.

Further, the wafer of the laser material module is connected to the wafer of the silicon photonic module by bonding in a form of chip-to-wafer or wafer-to-wafer.

BRIEF DESCRIPTION OF THE DRAWINGS

FIG. 2 is a schematic structural diagram of a high-frequency material module according to an embodiment of the present invention;

DETAILED DESCRIPTION OF THE EMBODIMENTS

To facilitate understanding, the present application will be described in more detail below with reference to the accompanying drawings. Embodiments of the present application are provided in the accompanying drawings. However, the present application can be implemented in many different forms and is not limited to the embodiments described herein. On the contrary, the purpose of providing these embodiments is to make the disclosure of the present application more thorough and comprehensive.

Unless otherwise defined, all technical and scientific terms used herein have the same meaning as those commonly understood by those skilled in the art of the present application. The terms used in the specification of the present application are only intended for describing specific embodiments rather than limit the present application.

It can be understood that spatial relationship terms such as "below", "under", "lower", "beneath", "above", "upper", etc. can be used herein to describe the relationship between an element or feature shown in the figures and other elements or features. It should be appreciated that in addition to orientations shown in the figures, the spatial relationship terms also encompass different orientations of devices in use and in operation. For example, if the devices in the figures are flipped, elements or features described as being "under other elements" or "beneath" or "below" other elements or features would then be oriented as being "above" the other elements or features. Therefore, exemplary terms "under" and "below" may include both upper and lower orientations. In addition, the devices may also be oriented in other ways (e.g., rotated 90 degrees or at other orientations), and the spatial description terms used herein should be interpreted accordingly.

It should be noted that when an element is considered to be "connected" to another element, it can be either directly connected to the other element or connected to the other element through a centered element. For the term "connection" in the following embodiments, if the connected circuits, modules, units, etc. transmit electrical signals or data to each other, "connection" should be understood as "electrical connection" or "communication connection", etc.

As used herein, the singular forms "a". "an", and "said/the" may also include plural forms unless the context clearly indicates otherwise. It should also be understood that the terms "comprise/include" or "have", etc. specify the existence of the stated features, wholes, steps, operations, components, parts, or combinations thereof, but do not exclude the possibility of the existence or addition of one or more other features, wholes, steps, operations, components, parts, or combinations thereof.

Figure 1:
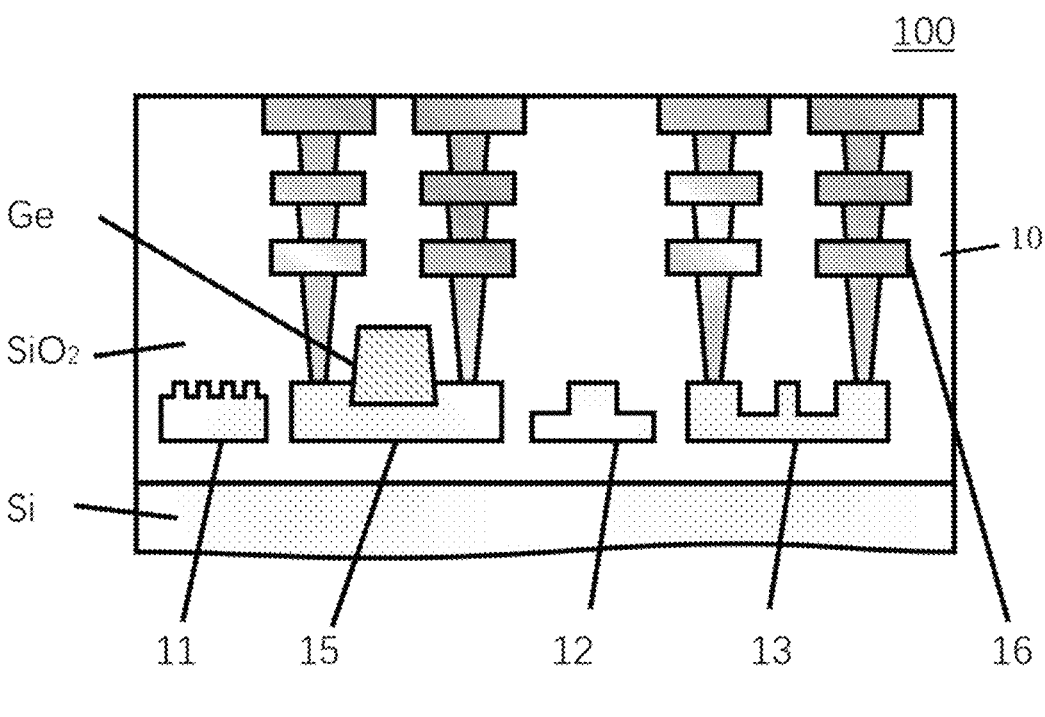
FIG. 1 is a schematic structural diagram of a silicon photonic module according to an embodiment of the present invention.

As shown in FIG. 1, the present application first discloses a modularized silicon-based heterogeneous photoelectric integrated architecture, which consists of a single unit module or is formed by at least two unit modules through wafer-level silicon-based photoelectric heterogeneous integration.

According to the requirements of silicon photonic integration, the unit module includes any one of a silicon photonic module 100, a high-frequency material module 200, a laser material module 300, an ultra-low-loss material module 400, or an integrated circuit module 500, where types of different unit modules in the same integrated architecture are different from each other.

The silicon photonic module 100 refers to a wafer which is fabricated using an SOI wafer with a top silicon thickness of approximately 200-300 nm and contains a silicon photonic device; the high-frequency material module 200 generally refers to a wafer which is fabricated using materials such as TFLN (thin film lithium niobate) and BTO (lithium carbonate) and contains a high-frequency modulation device; the laser material module 300 generally refers to a wafer which is fabricated using III-V group compound semiconductor materials such as InP and GaAs and contains a laser device and an amplifier device: the ultra-low-loss material module 400 generally refers to a wafer which is fabricated using dielectric materials such as SiN and SiON and contains an ultra-low-loss optical waveguide; and the integrated circuit module 500 generally refers to a wafer which is fabricated using materials such as Si, SiC, and GaN and contains an integrated circuit device.

As shown in FIG. 1, the silicon photonic module 100 includes a first silicon wafer 10, the first silicon wafer 10 is composed of a silicon substrate and a silicon dioxide buried compound, and the silicon buried compound contains a passive photonic device and an interconnect metal 16 serving as optical information transmission channels therein, where the passive photonic device includes a grating 11, a waveguide 12, and a modulator 13 which are formed by a plurality of Si etchings at different depths as well as a germanium device which is formed by local opening and germanium epitaxial growth, specifically, the germanium device includes germanium (Ge) and a germanium detector 15.

Figure 2:
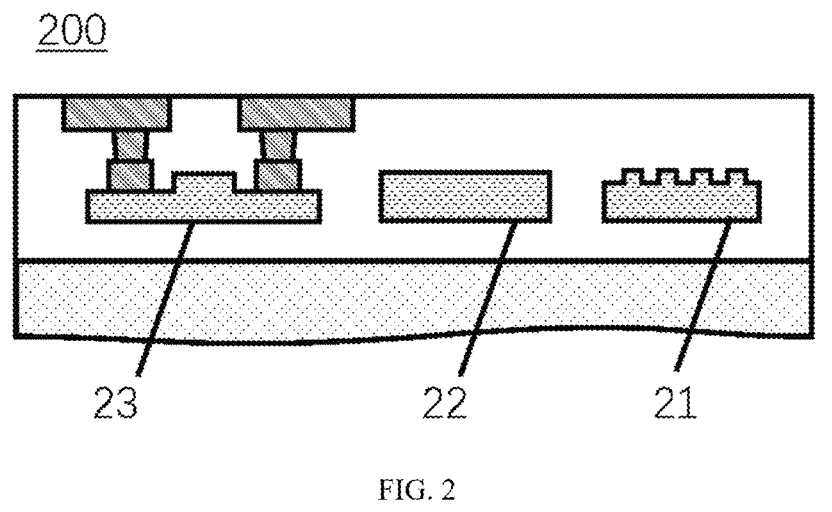

FIG. 2 shows a basic structure of the high-frequency material module 200. In this embodiment, the high-frequency material is illustrated by TFLN (thin film lithium niobate), and includes a passive photonic device formed on a corresponding silicon wafer by TFLN etching, specifically including a lithium niobate grating 21, a lithium niobate waveguide 22, and a lithium niobate modulator 23, where a metal electrode is connected to the lithium niobate modulator 23.

Figure 3:
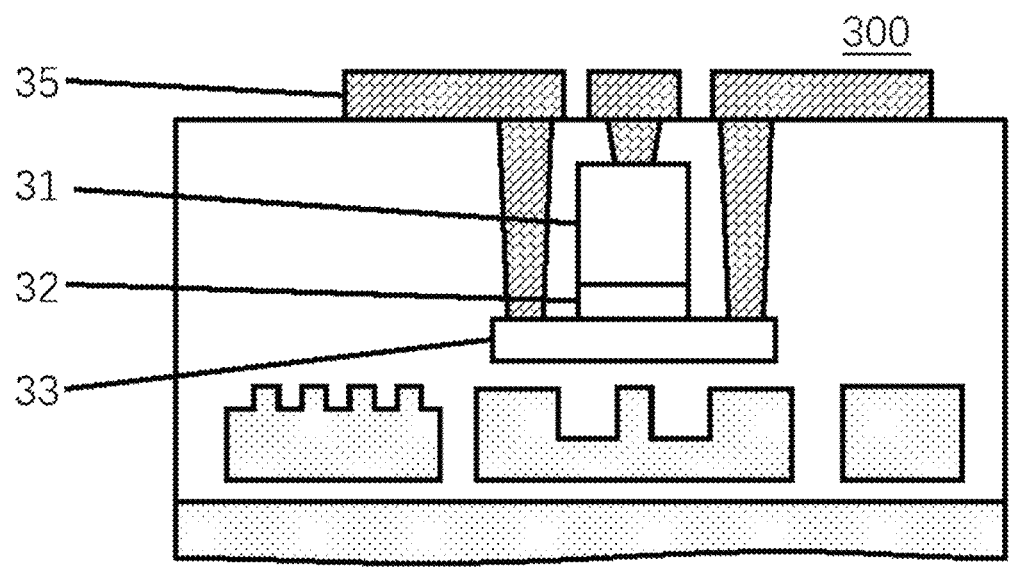
FIG. 3 is a schematic structural diagram of a laser material module according to an embodiment of the present invention.

FIG. 3 shows a schematic diagram of a basic structure of the laser material module 300. The III-V module 300 includes a III-V laser device formed by etching a III-V group semiconductor epitaxial material; a metal electrode 35 is connected to the III-V laser device; and the III-V group semiconductor epitaxial material includes an upper cladding layer 31, an active layer 32, and a lower cladding layer 33, where the III-V laser device is formed by stepwise etching the III-V group semiconductor epitaxial material.

Figure 4:
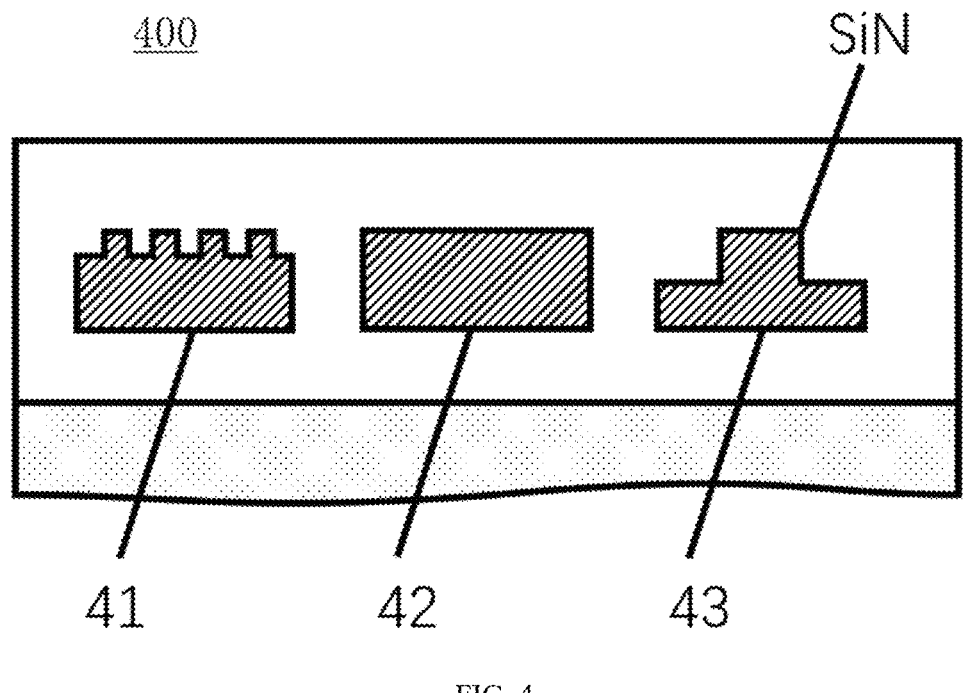
FIG. 4 is a schematic structural diagram of an ultra-low-loss material module according to an embodiment of the present invention.

FIG. 4 shows a schematic diagram of a basic structure of the ultra-low-loss material module 400. The ultra-low-loss material module includes a SiN device which is formed on a corresponding silicon wafer and is made of a SiN material, and may specifically include a SiN grating 41, a SiN waveguide 42, and a SiN coupler 43, where the SiN material may be SiOxNy.

Figure 5:
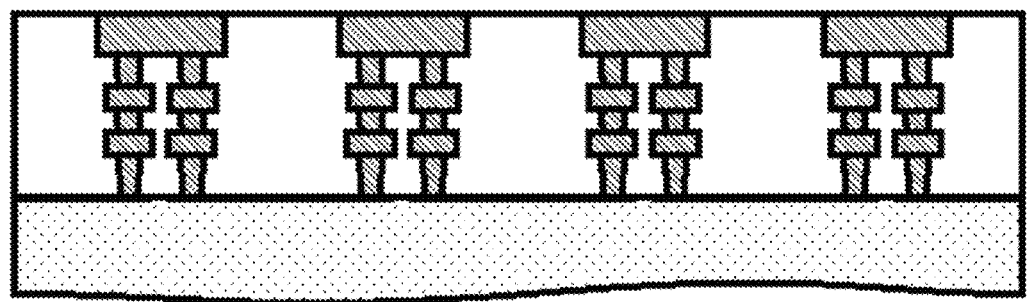
FIG. 5 is a schematic structural diagram of an integrated circuit module according to an embodiment of the present invention.

FIG. 5 is a schematic diagram of a basic structure of the integrated circuit module 500.

It can be understood that in the present application, each individual unit module is prepared into a predetermined silicon wafer with specific functional devices. When a combination is required, the silicon wafers of different modules can be combined based on wafer-level silicon-based photoelectric heterogeneous integration.

According to the silicon-based heterogeneous photoelectric integrated architecture provided by this embodiment, a modularized form is adopted, different functional units are used as individual unit modules, and then different types of integrated architectures are formed through customized increase and decrease in different usage scenarios. Among them, customized combinations of one unit module, two unit modules up to five unit modules can be adopted to construct up to 22 types of module-combined integrated architectures. By adopting a modularized solution, various functional materials can be easily selected and combined, thus improving a degree of freedom of integration and reducing costs.

The following 22 types of module combinations are obtained after combining different unit modules and eliminating other combinations that are less practical, as shown in Table 1: List of Implementable Silicon-based Heterogeneous Photoelectric Integrated Architectures.

TABLE 1

List of Implementable Silicon-based Heterogeneous
Photoelectric Integrated Architectures

| | | | | | |
|---|---|---|---|---|---|
| Integrated architecture 1 | Silicon photonic module | | | | |
| Integrated architecture 2 | Silicon photonic module | High-frequency material module | | | |
| Integrated architecture 3 | Silicon photonic module | | | Ultra-low-loss module | |
| Integrated architecture 4 | Silicon photonic module | High-frequency material module | | Ultra-low-loss module | |
| Integrated architecture 5 | Silicon photonic module | High-frequency material module | Laser material module | Ultra-low-loss module | |
| Integrated architecture 6 | Silicon photonic module | High-frequency material module | Laser material module | Ultra-low-loss module | Integrated circuit module |
| Integrated architecture 7 | Silicon photonic module | High-frequency material module | | Ultra-low-loss module | Integrated circuit module |
| Integrated architecture 8 | Silicon photonic module | | Laser material module | Ultra-low-loss module | |
| Integrated architecture 9 | Silicon photonic module | | Laser material module | Ultra-low-loss module | Integrated circuit module |
| Integrated architecture 10 | Silicon photonic module | | | Ultra-low-loss module | Integrated circuit module |
| Integrated architecture 11 | Silicon photonic module | | Laser material module | | |
| Integrated architecture 12 | Silicon photonic module | | | | Integrated circuit module |
| Integrated architecture 13 | | | Laser material module | | |
| Integrated architecture 14 | | High-frequency material module | Laser material module | | Integrated circuit module |
| Integrated architecture 15 | | High-frequency material module | Laser material module | | |
| Integrated architecture 16 | | | Laser material module | Ultra-low-loss module | |
| Integrated architecture 17 | | High-frequency material module | | | |
| Integrated architecture 18 | | High-frequency material module | | Ultra-low-loss module | |
| Integrated architecture 19 | | High-frequency material module | | Ultra-low-loss module | Integrated circuit module |
| Integrated architecture 20 | | | | | Integrated circuit module |
| Integrated architecture 21 | | | | Ultra-low-loss module | |
| Integrated architecture 22 | | | | | Integrated circuit module |

To provide a more comprehensive understanding of the integrated architectures in the present application, the embodiments of the present application are illustrated with the most complex integrated architecture 6 containing five unit modules.

To facilitate fabrication, the silicon photonic module 100, the ultra-low-loss module 400, and the high-frequency material module 200 are first integrated onto a silicon wafer, that is, the first silicon wafer. Specifically, the ultra-low-loss material module 400 includes a SiN device formed on the first silicon wafer by etching after SiN deposition via PECVD or LPCVD, and thin film lithium niobate is heterogeneously bonded onto the first silicon wafer; and interconnect metals are formed on both the high-frequency material module 200 and the germanium device.

A third silicon wafer corresponding to the integrated circuit module 500 and the first silicon wafer are subjected to wafer-level hybrid bonding.

Next, the laser material module 300 utilizes a second silicon wafer, a III-V laser device coupling region is formed in the second silicon wafer, a III-V group semiconductor epitaxial material is heterogeneously bonded to the second silicon wafer, and the III-V group semiconductor epitaxial material includes an upper cladding layer, an active layer, and a lower cladding layer distributed in a single stacked manner. The III-V laser device is formed by stepwise etching the III-V group semiconductor epitaxial material. The III-V module 300 and the SOI silicon photonic module form an integrated architecture through wafer-level bonding.

Figure 6:
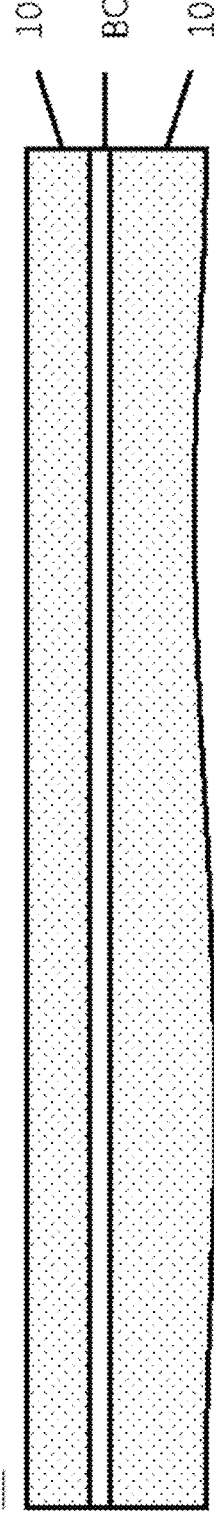
FIG. 6 is an initial structure of a first silicon wafer according to an embodiment of the present invention.

Specifically, an integration approach for the integrated architecture includes the following steps:

S1, integrating a silicon photonic module, an ultra-low-loss material module, a high-frequency material module, and an integrated circuit module on a first silicon wafer, where the step S1 includes:

S11, selecting the first silicon wafer, and fabricating a passive optical device and a germanium device on top silicon of the first silicon wafer;

FIG. 6 shows an initial structure of the first silicon wafer 10, including a Si substrate 101, a buried oxide BOX, and a top silicon layer 103, where a BOX layer has a thickness of 2-4 μm, and the top silicon layer has a thickness of approximately 200-350 nm.

Figure 7:
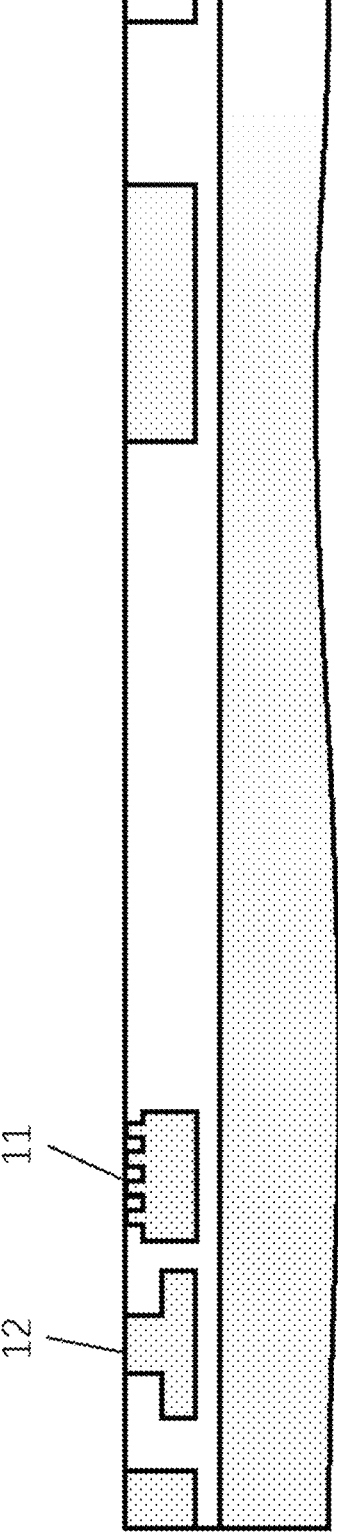
FIG. 7 is a schematic diagram of a structure after etching a passive photonic device in FIG. 6.

The passive photonic device such as a waveguide 12 and a grating 11 is formed by adopting multi-step Si etching and a plurality of Si etchings at different depths, as shown in FIG. 7.

Figure 8:
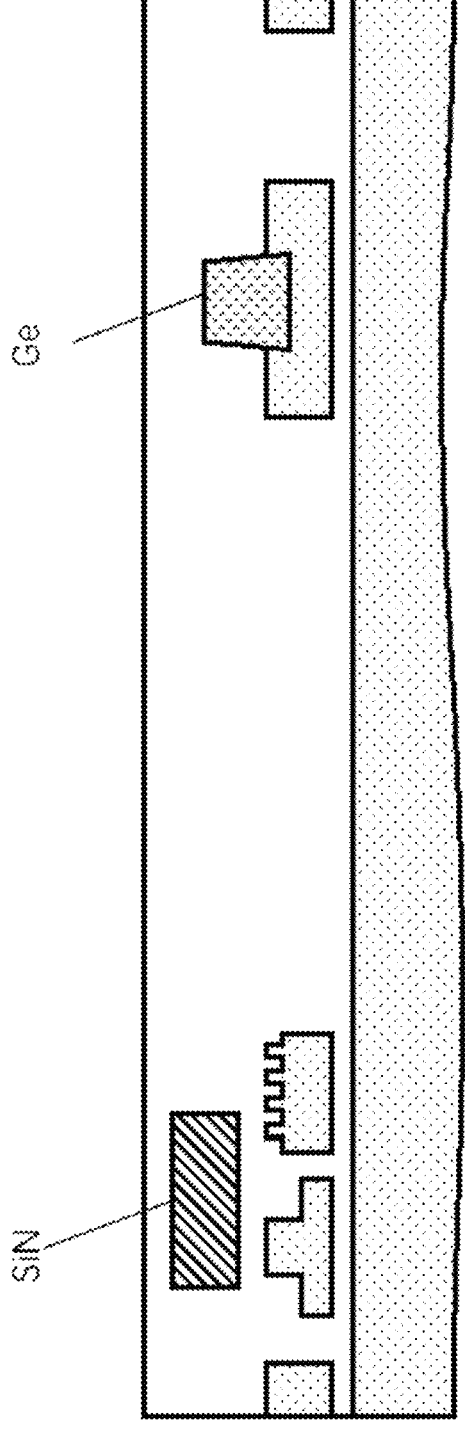
FIG. 8 is a schematic diagram of a structure after etching a SiN device in FIG. 7.

S12, providing the ultra-low-loss material module on the first silicon wafer, where the ultra-low-loss material module includes a SiN device formed on the first silicon wafer by etching after SiN deposition;

the SiN device is formed by etching after SiN deposition via PECVD or LPCVD, as shown in FIG. 8.

S13, heterogeneously bonding thin film lithium niobate on the first silicon wafer, and etching the thin film lithium niobate to form a high-frequency material module;

through local opening and germanium epitaxial growth, a Ge device is formed and a tungsten (W) through via is prepared.

Figure 9:
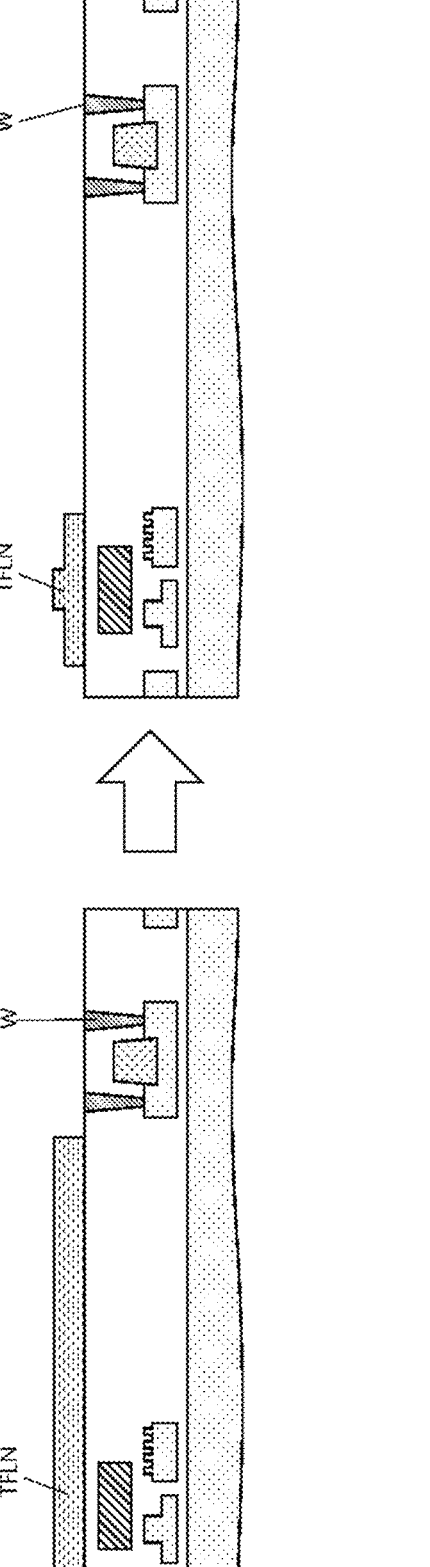
FIG. 9 is a schematic diagram of a structure after preparing a TFLN device in FIG. 8.

Metal is ohmic contacted by tungsten via, which is formed by SiO2 etching and silicide formation, and heterogeneous bonding of thin film lithium niobate (TFLN) is implemented by a wafer-to-wafer method or a chip-to-wafer method, where the TFLN can be replaced with other piezoelectric materials such as PZT in other embodiments, and a TFLN device is prepared by etching the TFLN, as shown in FIG. 9.

Figure 10:
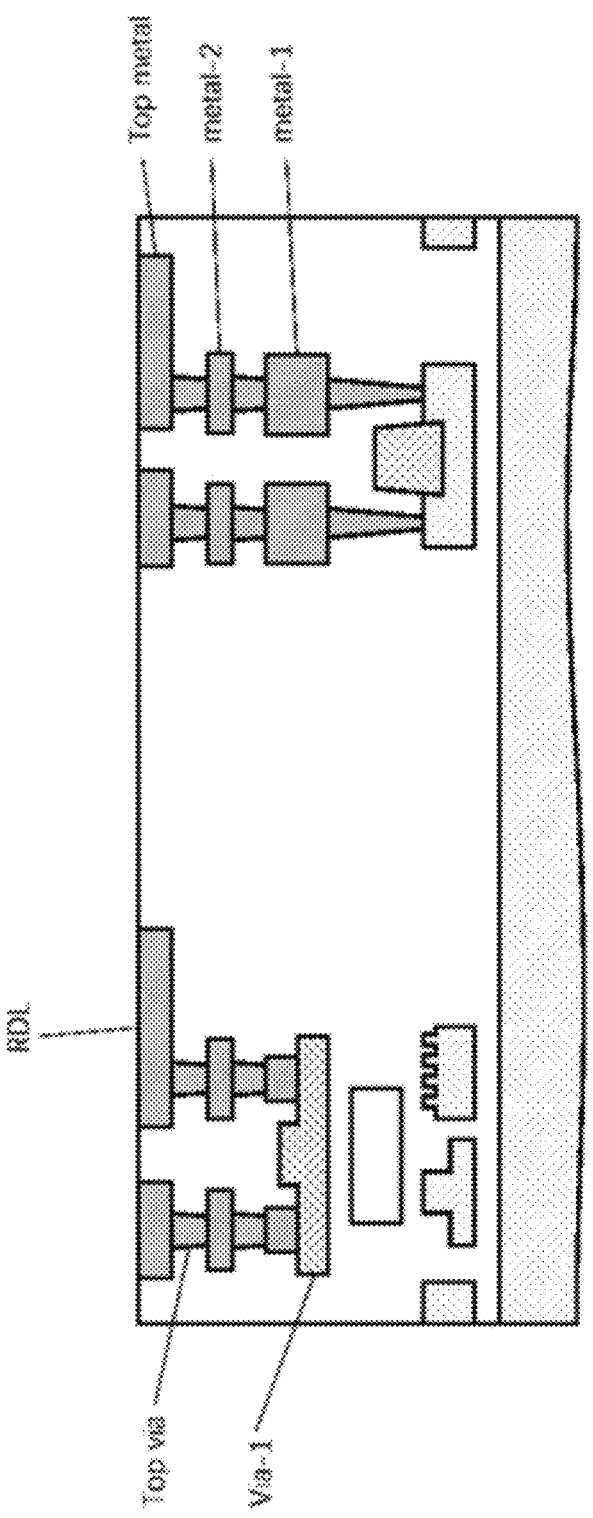
FIG. 10 is a schematic diagram of a structure after forming a metal electrode in FIG. 9.

S14, providing a plurality of layers of metal and vias on the germanium device and the TFLN module to form a metal electrode;

specifically, a plurality of layers of metals (divided into metal 1, metal 2, . . . , top metal by layer) and vias (via 1, . . . , top via) are fabricated by a damascene process, and a redistribution layer (RDL) for subsequent 3D packaging is prepared on the top metal, as shown in FIG. 10.

Figure 11:
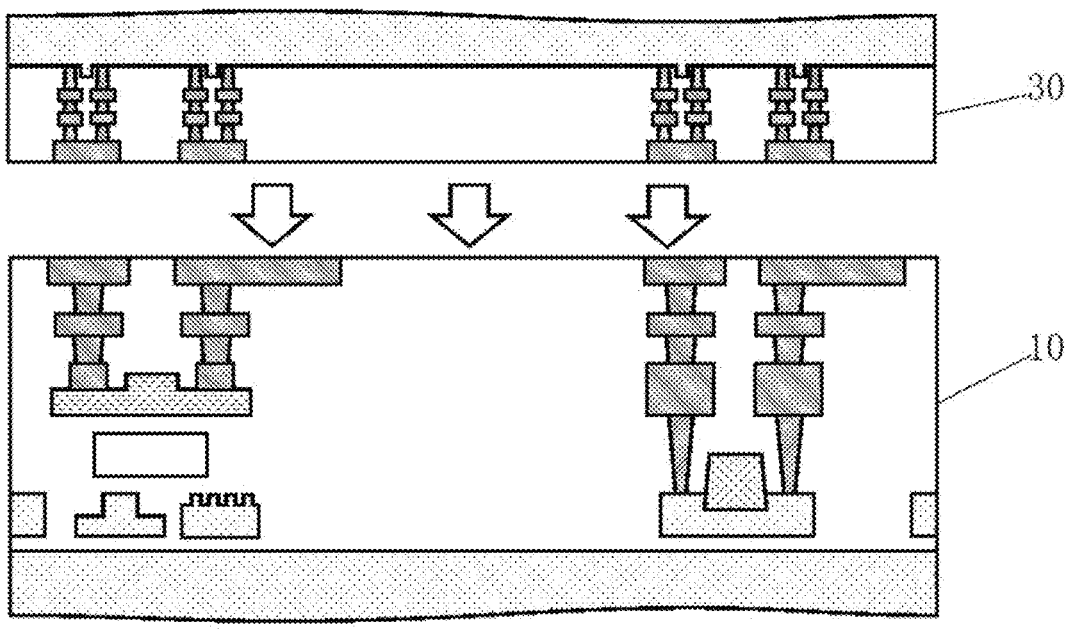
FIG. 11 is a schematic diagram of a state in which a third silicon wafer and a first silicon wafer are subjected to wafer-level hybrid bonding.
Figure 12:
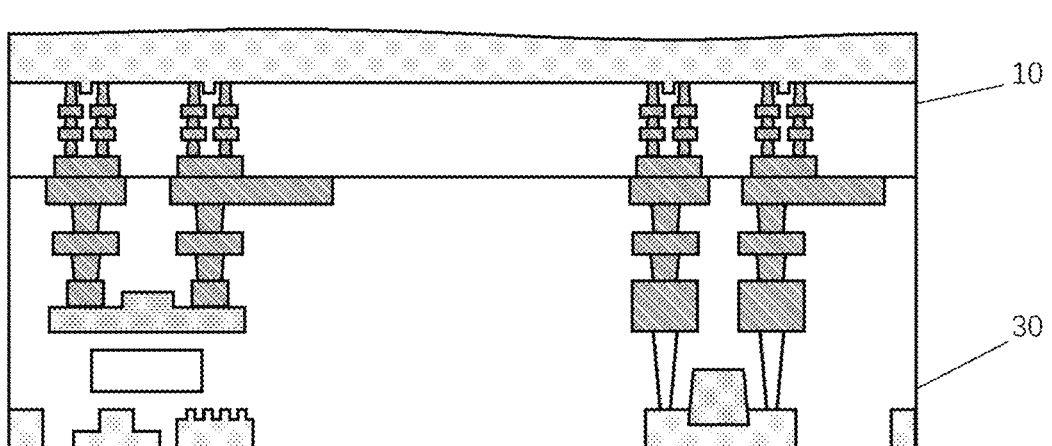
FIG. 12 is a schematic diagram of a structure after removing a substrate of the first silicon wafer in FIG. 11.

S15, performing wafer-level hybrid bonding on the third silicon wafer 30 containing a CMOS module and the first silicon wafer 10, as shown in FIG. 11, and removing the substrate of the first silicon wafer 10, as shown in FIG. 12, so that an architecture integrating a silicon photonic module, an ultra-low-loss material module, a high-frequency material module, and an integrated circuit module, i.e., the integrated architecture 7 in the table, is formed.

Figure 13:
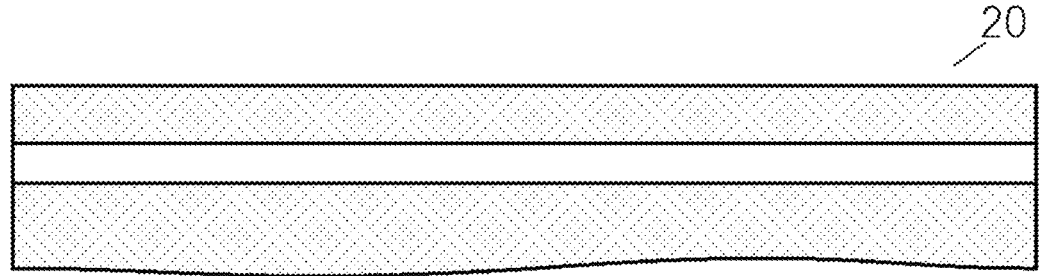
FIG. 13 is a schematic diagram of an initial structure of a second silicon wafer.

S2, preparing a laser material module on a second silicon wafer, where the step S2 includes:

S21, fabricating a passive photonic device on the second silicon wafer 20;

FIG. 13 shows an initial structure of the second silicon wafer 20, which is structurally similar to the second silicon wafer 10. However, a thickness of a BOX layer of the second silicon wafer 20 is less than 100 nm, and a thickness of a top silicon layer thereof is 400-700 nm which is thicker than that of top silicon of a conventional silicon photonic wafer. This top silicon layer is mainly used for coupling with evanescent waves of the III-V laser device.

Figure 14:
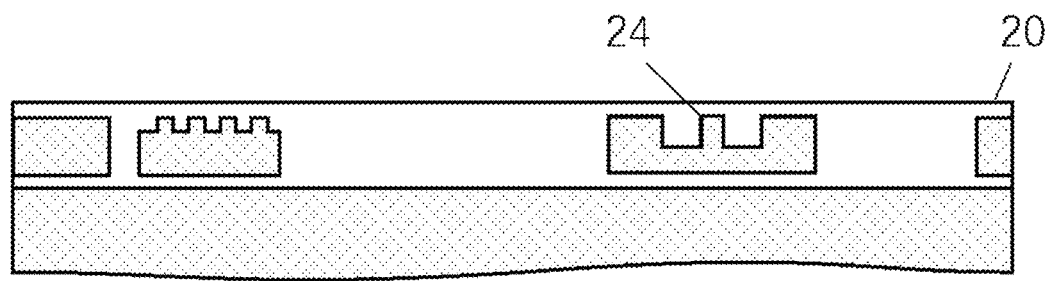
FIG. 14 is a schematic diagram of a structure after etching a passive photonic device in FIG. 13.

As shown in FIG. 14, the passive photonic device such as a silicon waveguide and a grating is formed by multi-step etching and a plurality of Si etchings at different depths, where a III-V laser device coupling region 24 is formed on the second silicon wafer 20.

Figure 15:
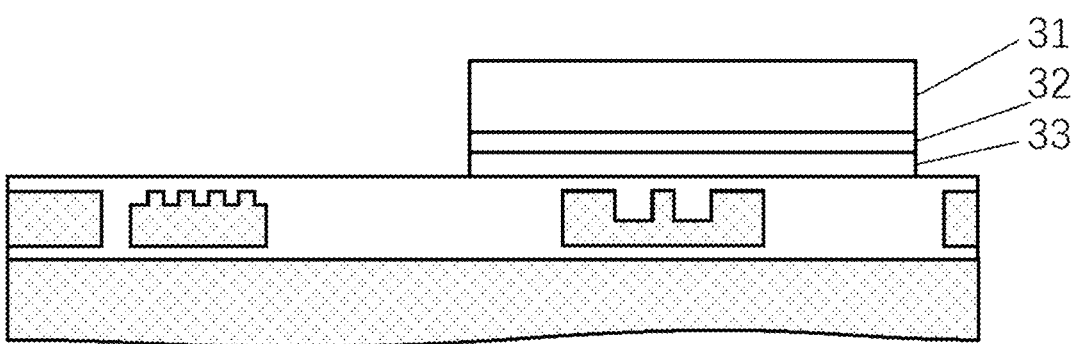
FIG. 15 is a schematic diagram of a structure after heterogeneously bonding a III-V group semiconductor epitaxial material in FIG. 14.

S22, providing a III-V group semiconductor epitaxial material on the second silicon wafer;

heterogeneous bonding of the III-V group semiconductor epitaxial material is implemented by a wafer-to-wafer method or a chip-to-wafer method, and the III-V group semiconductor epitaxial material includes InP, GaAs, and the like, where the III-V group semiconductor epitaxial material includes an upper cladding layer 31, an active layer 32 (i.e., quantum wells or quantum dots), and a lower cladding layer 33, as shown in FIG. 15.

Figure 16:
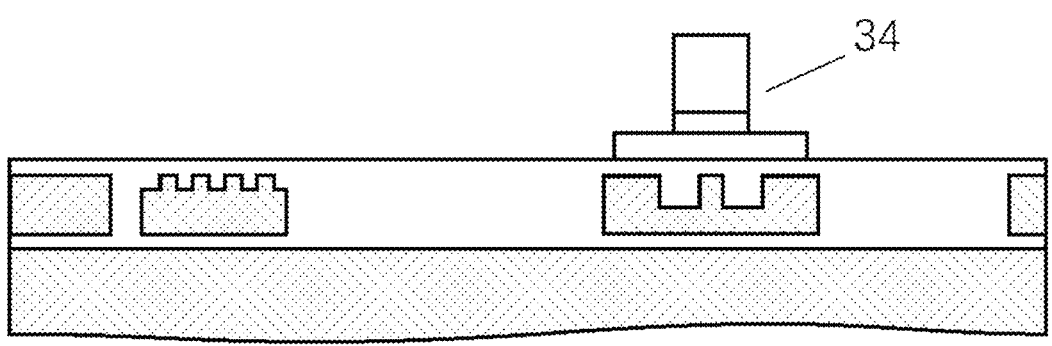
FIG. 16 is a schematic structure of a structure in FIG. 15 after stepwise etching the III-V group semiconductor epitaxial material to form a III-V laser device.

S23, performing etching on the III-V group semiconductor epitaxial material to form a III-V laser device;

the upper cladding layer, the active layer (i.e., quantum wells or quantum dots), and the lower cladding layer are stepwise etched to form the III-V laser device 34, as shown in FIG. 16.

S24, fabricating a plurality of layers of metal and vias on the III-V laser device to form a metal electrode.

Figure 17:
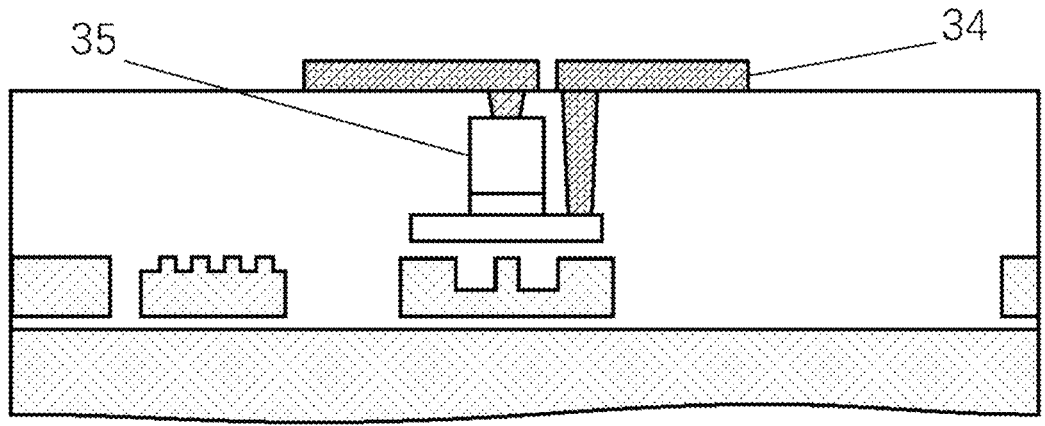
FIG. 17 is a schematic diagram of a structure after forming a metal electrode of an upper cladding layer and a lower cladding layer in FIG. 16.

The metal electrode 35 of the upper cladding layer 31 and the lower cladding layer 33 is formed by first depositing SiO2, followed by etching holes through SiO2 and filling with metal (such as Au or Ti), as shown in FIG. 17.

S3, performing wafer-level bonding on the first silicon wafer and the second silicon wafer.

Figure 18:
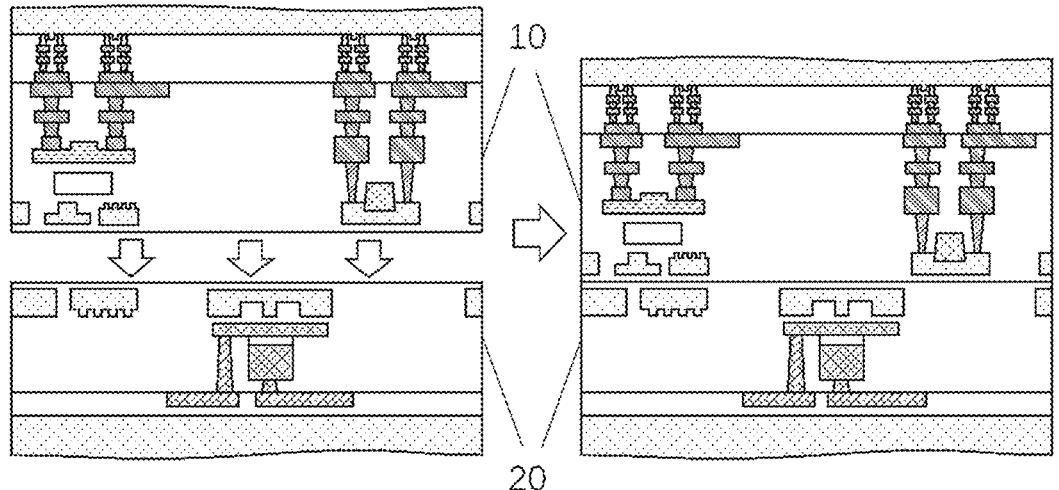
FIG. 18 is a schematic diagram of a state in which a second silicon wafer and a first silicon wafer are aligned for wafer-level bonding.

The prepared second silicon wafer 20 as described above is bonded to a carrier wafer using an insulating bonding adhesive, and then the second silicon wafer 20 and the first silicon wafer 10 are aligned for wafer-level bonding, as shown in FIG. 18.

At this point, the integration of the integrated architecture 6 in the table is completed.

To facilitate packaging, based on the above steps, the integration method further includes: S4, thinning a substrate on the first silicon wafer 10;

specifically, the substrate on the CMOS wafer side is thinned to approximately 10 μm by grinding and etching.

Figure 19:
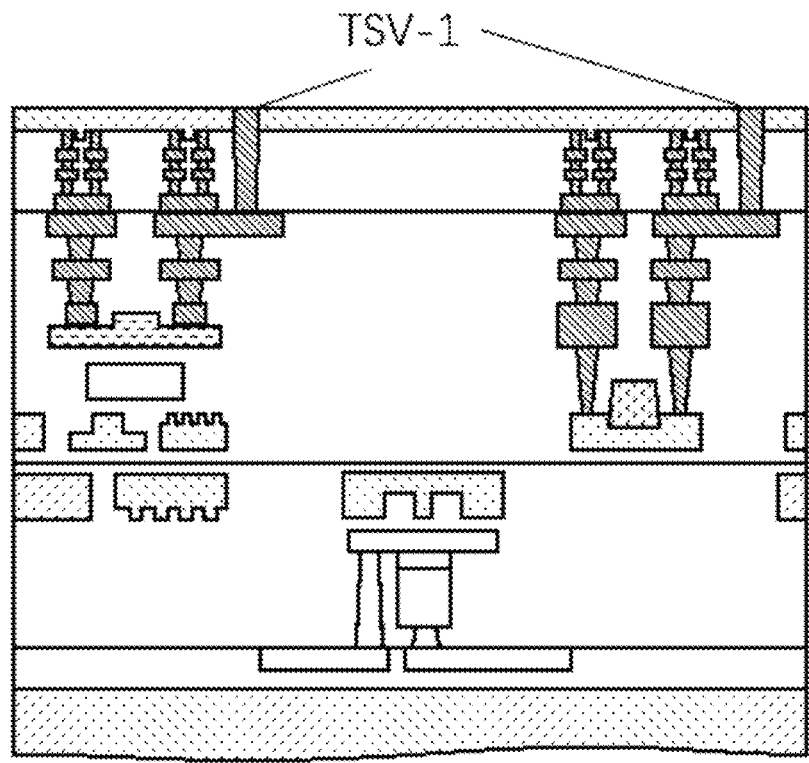
FIG. 19 is a schematic diagram of a structure after implementing steps S4 and S5 in FIG. 18.
Figure 20:
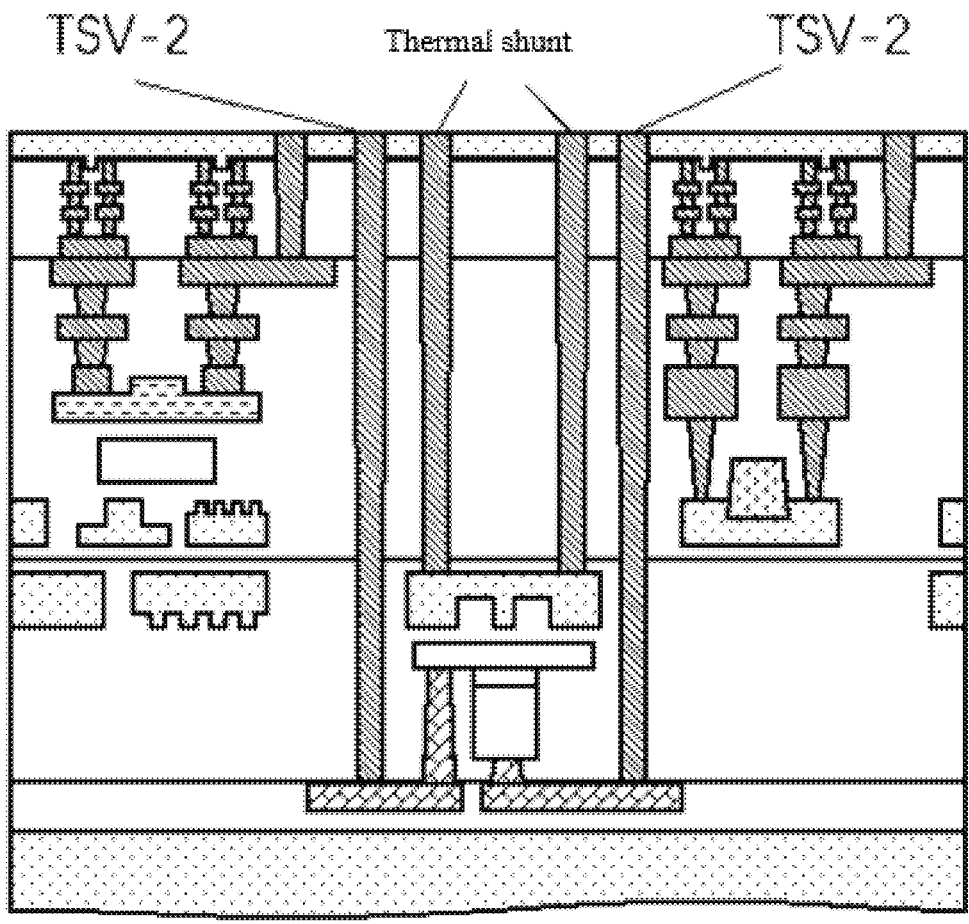
FIG. 20 is a schematic diagram of a structure after implementing step S6 in FIG. 19.
Figure 21:
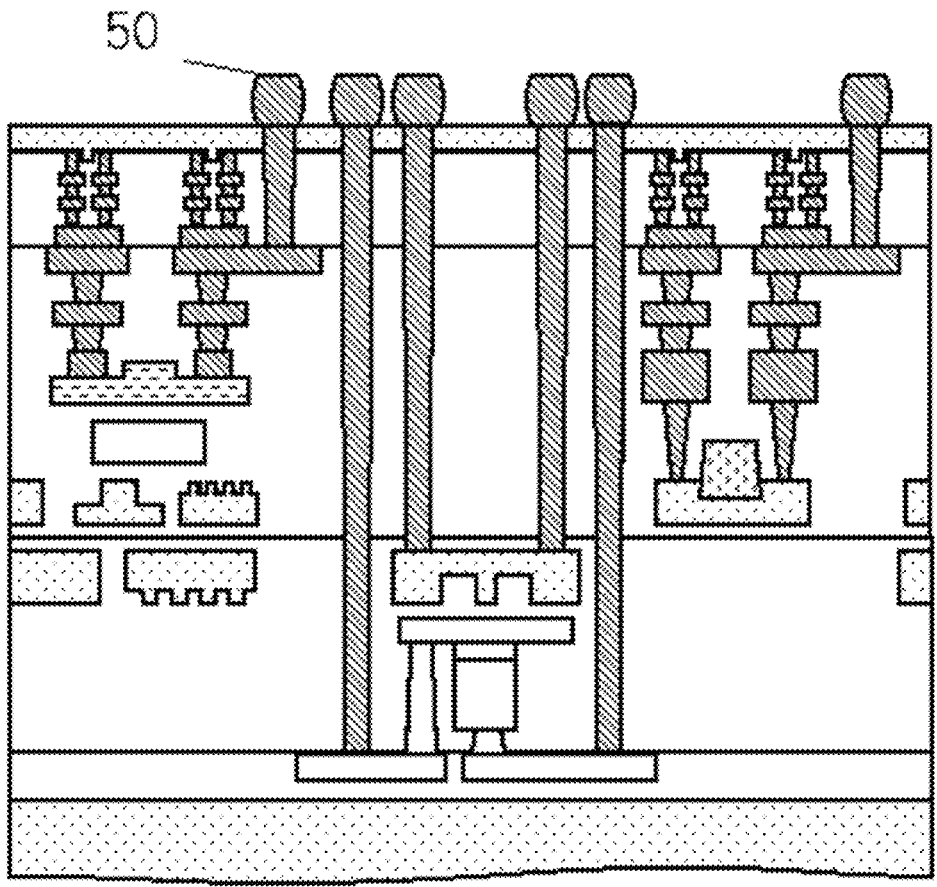
FIG. 21 is a schematic diagram of a structure after forming micro-bumps in FIG. 20.

S5, extracting a redistribution layer electrode at a bonding interface of a third silicon wafer containing the integrated circuit module and the first silicon wafer to form a first through silicon via (TSV-1);

specifically, as shown in FIG. 19, the through via is etched to penetrate the wafer, the RDL is used as a stop layer, metal Cu is filled to form the first through silicon via, and a photoelectric RDL is extracted;

S6, forming a second through silicon via which is electrically connected to the metal electrode of a III-V laser device specifically, the wafer is penetrated by through via etching. Au is used as the stop layer, metal Cu is filled to form the second through silicon via, and an electrode of the III-V laser device is extracted; and Si is used as the stop layer, and metal Cu is filled to form a thermal shunt, as shown in FIG. 20;

S7, preparing micro-bumps 50 on the first through silicon via and the second through silicon via for packaging with a printed circuit board (PCB), as shown in FIG. 21, which is an overall architecture after preparation.

The foregoing descriptions are merely preferred embodiments of the present invention, but are not intended to limit the present invention. Any modification, equivalent replacement, or improvement made without departing from the spirit and principle of the present invention shall fall within the protection scope of the present invention.

What is claimed is:

1. An integration method for a modularized silicon-based heterogeneous photoelectric integrated architecture, wherein the integration method is used for integrating a modularized silicon-based heterogeneous photoelectric integrated architecture and comprises the following steps:

S1, integrating an ultra-low-loss material module, a high-frequency material module, and an integrated circuit module on a first silicon wafer;

S2, preparing a laser material module on a second silicon wafer, and performing wafer-level bonding on the first silicon wafer and the second silicon wafer;

S3, thinning a substrate on the first silicon wafer;

S4, extracting a redistribution layer electrode at a bonding interface of a third silicon wafer containing the integrated circuit module and the first silicon wafer to form a first through silicon via;

S5, forming a second through silicon via which is electrically connected to the metal electrode of a III-V laser device;

S6, preparing micro-bumps on the first through silicon via and the second through silicon via for packaging with a printed circuit board, wherein the step S1 comprises:

S11, selecting the first silicon wafer, and fabricating a passive optical device and a germanium device on top silicon of the first silicon wafer to obtain a silicon photonic module;

S12, providing the ultra-low-loss material module on the silicon photonic module, wherein the ultra-low-loss material module comprises a SiN device formed on the first silicon wafer by etching after SiN deposition;

S13, heterogeneously bonding a thin film lithium niobate on the first silicon wafer, and etching the thin film lithium niobate to form a thin film lithium niobate device;

S14, providing a plurality of layers of metal and vias on the germanium device and the thin film lithium niobate device to form a metal electrode; and S15, performing wafer-level hybrid bonding on a third silicon wafer containing the integrated circuit module and the first silicon wafer, and removing a substrate of the first silicon wafer;

the step S2 comprises:

S21, fabricating a passive photonic device on the second silicon wafer;

S22, providing a III-V group semiconductor epitaxial material on the second silicon wafer;

S23, performing etching on the III-V group semiconductor epitaxial material to form a III-V laser device; and S24, fabricating a plurality of layers of metal and vias on the III-V laser device to form a metal electrode, wherein the step S22 comprises: heterogeneously bonding the III-V group semiconductor epitaxial material to the second silicon wafer by a wafer-to-wafer method or a chip-to-wafer method, wherein the III-V group semiconductor epitaxial material comprises an upper cladding layer, an active layer, and a lower cladding layer.

2. The integration method for a modularized silicon-based heterogeneous photoelectric integrated architecture according to claim 1, wherein the high-frequency material module comprises the thin film lithium niobate capable of being heterogeneously bonded to a wafer of the silicon photonic module.

3. The integration method for a modularized silicon-based heterogeneous photoelectric integrated architecture according to claim 1, wherein the ultra-low-loss material module comprises a SiN device formed by etching after SiN deposition via PECVD or LPCVD.

4. The integration method for a modularized silicon-based heterogeneous photoelectric integrated architecture according to claim 1, wherein the wafer of the integrated circuit module is connected to the wafer of the silicon photonic module by bonding in a form of chip-to-wafer or wafer-to-wafer.

5. The integration method for a modularized silicon-based heterogeneous photoelectric integrated architecture according to claim 1, wherein the wafer of the laser material module is connected to the wafer of the silicon photonic module by bonding in a form of chip-to-wafer or wafer-to-wafer.

* * * * *